US012126340B2

(12) United States Patent
Hein (10) Patent No.: US 12,126,340 B2
(45) Date of Patent: Oct. 22, 2024

(54) MAGNETICALLY-ACTIVATED SOLID STATE SWITCHES

(71) Applicant: Allegro MicroSystems, LLC, Manchester, NH (US)

(72) Inventor: Matthew Hein, Dallas, TX (US)

(73) Assignee: Allegro MicroSystems, LLC, Manchester, NH (US)

( * ) Notice: Subject to any disclaimer, the term of this patent is extended or adjusted under 35 U.S.C. 154(b) by 30 days.

(21) Appl. No.: 18/174,957

(22) Filed: Feb. 27, 2023

(65) Prior Publication Data

US 2024/0291468 A1    Aug. 29, 2024

(51) Int. Cl.
*H03K 3/01*     (2006.01)
*G01R 33/06*   (2006.01)

(52) U.S. Cl.
CPC .............. *H03K 3/01* (2013.01); *G01R 33/06* (2013.01)

(58) Field of Classification Search
CPC ..................................................... G01R 33/06
See application file for complete search history.

(56) References Cited

U.S. PATENT DOCUMENTS

| | | | |
|---|---|---|---|
| 6,356,741 B1 | 3/2002 | Bilotti et al. | |
| 6,622,012 B2 | 9/2003 | Bilotti et al. | |
| 7,085,119 B2 | 8/2006 | Bilotti et al. | |
| 7,307,824 B2 | 12/2007 | Bilotti et al. | |
| 8,008,908 B2 * | 8/2011 | Doogue | G01D 5/145 324/173 |
| 8,222,888 B2 * | 7/2012 | David | G01R 33/09 324/207.13 |
| 9,664,752 B2 | 5/2017 | Monreal et al. | |
| 9,733,106 B2 | 8/2017 | Judkins, III et al. | |
| 9,897,464 B2 | 2/2018 | Judkins, III et al. | |
| 10,088,533 B2 | 10/2018 | Rivas et al. | |
| 10,120,095 B2 * | 11/2018 | Nakayama | H03K 17/9547 |
| 11,152,938 B2 * | 10/2021 | Judkins, III | H03K 17/9505 |

OTHER PUBLICATIONS

"TPSI3050-Q1 Automotive Reinforced Isolated Switch Driver with Integrated 10-V Gate Supply", Texas Instruments, TPSI3050-Q1 data sheet, SLVSFJ7C—Nov. 2021, Revised Apr. 2023; 44 pages.
"LM74610-Q1 Zero IQ Reverse Polarity Protection Smart Diode Controller", Texas Instruments, LM74610-Q1 data sheet, SNOSCZ1B—Jul. 2015, Revised Jun. 2016; 31 pages.

* cited by examiner

*Primary Examiner* — Sibin Chen
(74) *Attorney, Agent, or Firm* — DALY, CROWLEY, MOFFORD & DURKEE, LLP (57) ABSTRACT

Magnetically-activated solid state switches can include a magnetic field sensor, control circuitry configured to implement a comparison or ON/OFF logic, an output switch, a rectifier, power regulator, and charge pump, as shown. A magnetically-activated solid state switch can include a sensor bias or driver block. An analog front end may be present to amplify and/or condition the output signals produced by magnetic field sensor. Terminals can accommodate a unidirectional DC input signal or a bidirectional or AC input signal. In the ON state, the solid state output switch is configured by the control circuitry to turn OFF at a periodic rate to maintain sufficient charge to allow the solid state magnetic field sensor to sense a magnetic field. In the OFF state, the low-power regulator can periodically turn on and provide power to the magnetic field sensor for taking a magnetic field measurement.

29 Claims, 5 Drawing Sheets

MAGNETICALLY-ACTIVATED SOLID STATE SWITCHES

BACKGROUND

Reed switches are a type of magnetic switch that utilize mechanical movement of a magnetically sensitive element to effect switching in response to an applied magnetic field. A reed switch typically consists of a pair of ferromagnetic flexible metal contacts in a sealed glass enclosure. The contacts are usually normally open, closing when a magnetic field is present, or they may be normally closed and open when a magnetic field is applied. The switch may be actuated by an electromagnetic coil, making a relay, or by bringing a permanent magnet near it. When the magnetic field is removed, the contacts in the reed switch return to their original position. The "reed" is the metal part inside the reed switch envelope that is relatively thin and wide to make it flexible.

Reed switches, as mechanical devices, typically have a number of disadvantages arising from their mechanical nature. For example, a reed switch is a typically a relatively large component and options for size reduction can be limited. Reed switches, as mechanical devices, are not devices that can be configured. Over the lifetime of a given reed switch it may begin to "stick" or "miss," indicating that the component is no longer opening or closing due to demagnetization or over-magnetization. A typical reed switch may be easily broken by cracking the glass enclosure. A reed switch may be enclosed in plastic to help improve the durability, but this increases the cost and size of the switch.

Reed switches are also typically negatively impacted by shock and vibration which can separate the contacts of the switch. As a result, under conditions subject to shock and vibration, reed switches can have "contact bounce" which causes the terminals to make and break contact multiple times when switching. This can require circuit designers to implement external circuits to compensate for the contact bouncing and "debounce" the circuit. Moreover, another mechanical limitation of reed switches is that they sense a magnetic field in all three dimensions/axes and cannot be limited to one particular axis of sensing.

SUMMARY

An aspect of the present disclosure includes a magnetically-activated solid state switch. The solid state switch can include a magnetic field sensor configured to make one or more magnetic field measurements and produce corresponding output signals; a solid state output switch configured to produce an output current in an ON state and to produce negligible current in an OFF state; control circuitry configured to implement ON/OFF logic for determining an ON or OFF condition for the solid state output switch and controlling the solid state output switch to be in the ON state or the OFF state respectively; a charge pump connected to the solid state output switch and control circuitry and configured to (i) respond to the control circuitry determining an OFF condition by supplying voltage to the solid state output switch to switch the solid state output switch to the OFF state, and (ii) respond to the control circuitry determining an ON condition by turning the solid state output switch to the ON state, where in the ON state, the solid state output switch is configured by the control circuitry to turn off at a periodic rate to maintain sufficient charge to allow the solid state magnetic field sensor to sense a magnetic field; and a low-power regulator configured to provide power to the magnetic field sensor and control circuitry, where when the solid state output switch is in the OFF state, where the low-power regulator is configured to periodically turn on and provide power to the magnetic field sensor for taking a magnetic field measurement.

Implementations may include one or more of the following features. The periodic rate at which the solid state switch is turned off can be based on a value (e.g., present and/or programmed in operation) stored in the control circuitry. The periodic rate can be based on a decay of a voltage of the solid state output switch. The magnetic field sensor may include one or more Hall effect elements. The solid state switch may include a driver circuit configured to provide bias voltage to the one or more Hall effect elements. The magnetic field sensor may include one or more magnetoresistance (MR) elements. The one or more MR elements may include one or more giant magnetoresistance (GMR) elements. The one or more MR element may include one or more anisotropic magnetoresistance element (AMR) elements. The one or more MR element may include one or more tunneling magnetoresistance (TMR) elements. The magnetic field sensor can be configured to measure the magnetic field along one axis. The magnetic field sensor can be configured to measure the magnetic field along two axes. The magnetic field sensor can be configured to measure the magnetic field along three axes. The solid state output switch may include a field effect transistor (FET) or a bipolar transistor. The field effect transistor (FET) may include a MOSFET. The solid state output switch may include first and second MOSFETs in a back-to-back configuration to prevent reverse current flow in either direction when off. The control circuitry may include a comparator configured to compare a voltage output from the magnetic field sensor to a threshold voltage. The control circuitry may include a digital signal processor (DSP) configured to calculate a position angle based on two output signals received from the magnetic field sensor. The solid state switch may include an analog-to-digital converter (ADC) configured to receive one or more analog signals from the magnetic field sensor and produce corresponding digital signals. The magnetic field measurement may include a magnetic flux density measurement.

One general aspect includes a method of controlling a solid state switch having a solid state output switch and a magnetic field sensor. The method can include, with control circuitry, receiving an output signal from a magnetic field sensor; with the control circuitry, performing a comparison of the output signal to a threshold value; with the control circuitry, performing a determination of an ON or OFF state for a solid state output switch based on the comparison; with the control circuitry, controlling an output state of the solid state output switch to be an ON state or an OFF state based on the determination; providing a charge pump connected to the solid state output switch and control circuitry and configured to (i) respond to the control circuitry determining an OFF condition by supplying voltage to the solid state output switch to switch the solid state output switch to the OFF state, and (ii) respond to the control circuitry determining an ON condition by turning the solid state output switch to the ON state, where in the ON state, the solid state output switch is configured by the control circuitry to turn off at a periodic rate to maintain sufficient charge to allow the solid state magnetic field sensor to sense a magnetic field; and providing a low-power regulator configured to provide power to the magnetic field sensor and control circuitry, where when the solid state output switch is in the OFF state, where the low-power regulator is configured to periodically turn on and provide power to the magnetic field sensor for taking a magnetic field measurement.

Implementations may include one or more of the following features. The magnetic field sensor may include one or more Hall effect elements. The magnetic field sensor may include one or more magnetoresistance (MR) elements. The one or more magnetoresistance elements may include one or more AMR elements. The one or more magnetoresistance elements may include one or more GMR elements. The one or more magnetoresistance elements may include one or more TMR elements. The solid state output switch may include a field effect transistor (FET) or a bipolar transistor. The FET may include a MOSFET. The solid state output switch may include a first MOSFET coupled to a second MOSFET in a back to back configuration. The method may include retrofitting the solid state switch in place of a magnetic reed switch.

A system of one or more computers can be configured to perform particular operations or actions, as described for magnetic switch circuitry herein, e.g., programming or providing instructions for ON/OFF logic in non-volatile memory, by virtue of having software, firmware, hardware, or a combination of them installed on the system that in operation causes or cause the system to perform the actions. One or more computer programs can be configured to perform particular operations or actions by virtue of including instructions that, when executed by data processing apparatus, such as one or more digital signal processors (DSPs) and/or other types of digital processors, cause the apparatus to perform the described actions in whole or in part.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. In the figures like reference characters refer to like components, parts, elements, or steps/actions; however, similar components, parts, elements, and steps/actions may be referenced by different reference characters in different figures. It should be appreciated that the components and structures illustrated in the figures are not necessarily to scale, emphasis instead being placed upon illustrating the principals of the concepts described herein.

It should be understood that embodiments are illustrated by way of example and not limitation in the figures, in which.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects of the present disclosure are directed to circuits (circuitry), systems, methods (processes), apparatus and components providing magnetically-activated solid state switches and related functionality. In some examples, the switches may be suitable for replacing mechanical switches such as so-called reed switches. In some examples, a magnetically-activated solid state switch circuit can include a solid state magnetic field sensor including one or more magnetic field sensing elements.

Figure 1A:
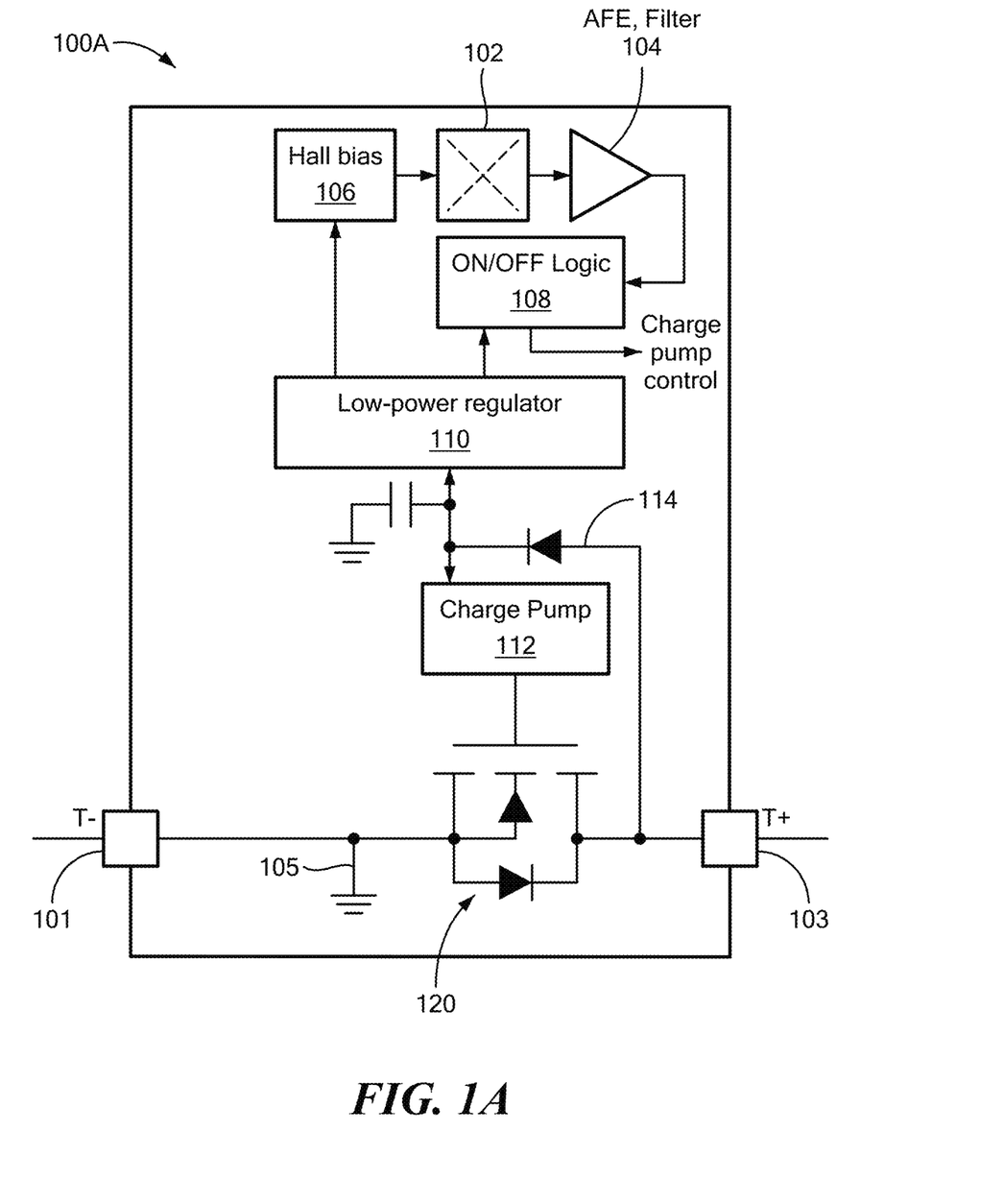
FIG. 1A is a block diagram of an example magnetically-activated solid state switch employing a single MOSFET output switch, in accordance with the present disclosure.
Figure 1B:
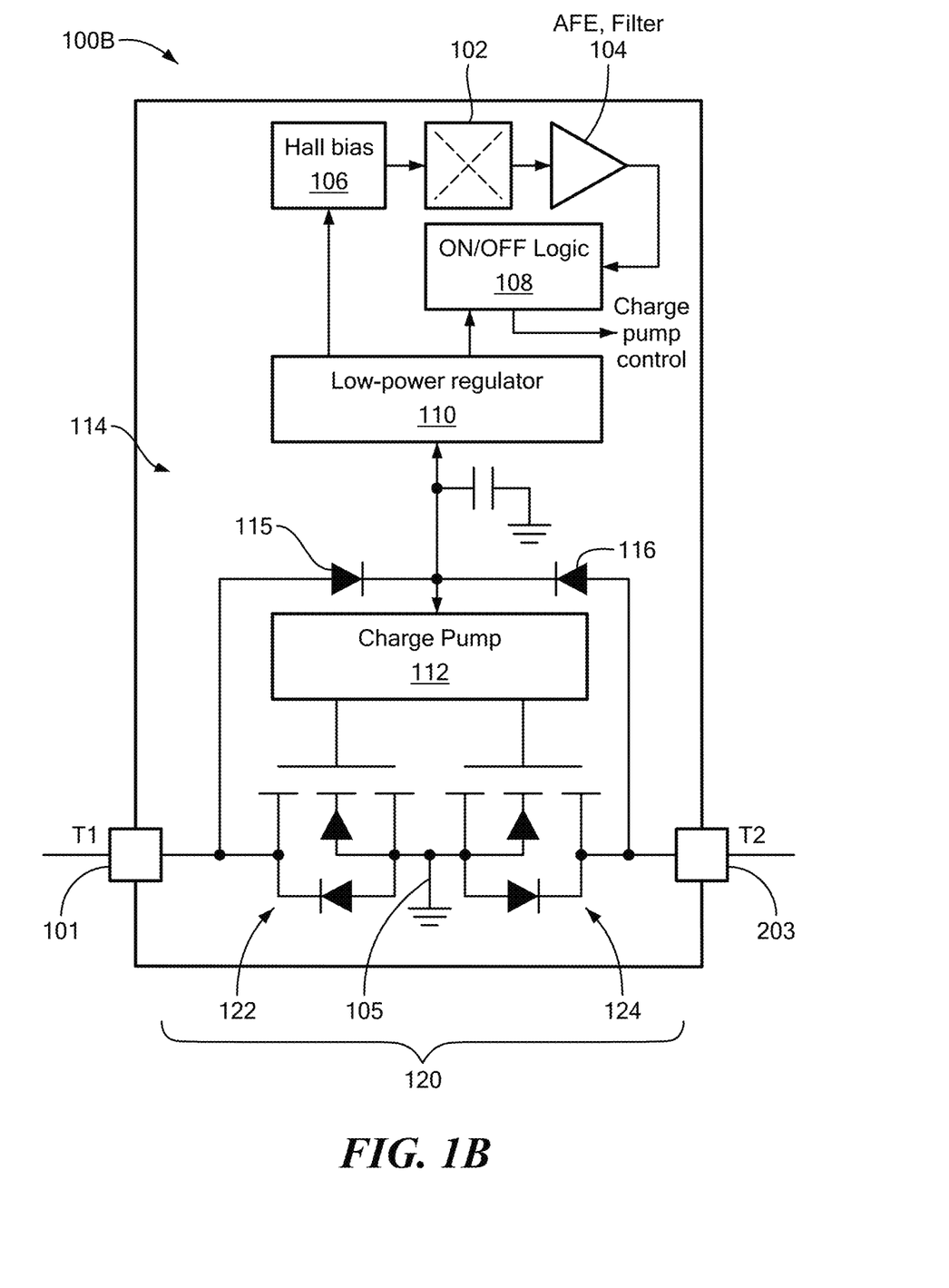
FIG. 1B is a block diagram of another example of a magnetically-activated solid state switch employing back-to-back MOSFET output switches, in accordance with the present disclosure.

FIGS. 1A-B are block diagrams of example magnetically-activated solid state switches 100A-B, in accordance with the present disclosure. Switches 100A-B are similar with generally common architectures but have different output switch configurations. FIG. 1A is a block diagram of an example magnetically-activated solid state switch 110A having a solid state output switch employing a single MOSFET. FIG. 1B is a block diagram of a similar example of a magnetically-activated solid state switch 100B having a solid state output switch employing two back-to-back MOSFETs. In some examples, solid state switches 110A, 110B can be configured or operational as high-voltage switches.

Solid state switch 100 can include a magnetic field sensor 102, ON/OFF logic 108, output switch 120, rectifier 114, power regulator 110, and charge pump 112, as shown. Solid state switch 100 can also include a sensor bias or driver block (shown as "Hall bias") 106 for generating a sufficient drive or bias signals, e.g., voltage(s), to be applied to the magnetic field sensor 102 (shown as a Hall effect sensor). An analog front end ("AFE") 104 may be present to amplify and/or condition the output signals produced by magnetic field sensor 102. In some examples, AFE 104 can include one or more amplifiers and/or filters. Terminals 101, 103 are shown for two cases: a unidirectional DC input signal in FIG. 1A, and a bidirectional or AC input signal in FIG. 1B. The magnetic field sensor 102 can measure or react to an applied magnetic field in one, two, or three dimensions/directions (X, Y, Z axes).

The magnetic field sensor 102 can include a suitable solid state magnetic field sensor such as a Hall effect element or a magnetoresistance (xMR) element, e.g., a semiconductor magnetoresistance element such as Indium Antimonide (InSb), a giant magnetoresistance (GMR) element, an anisotropic magnetoresistance element (AMR), a tunneling magnetoresistance (TMR) element, a.k.a., magnetic tunnel junction (MTJ).

Control circuitry 108, configured to implement a comparison (ON/OFF logic), can process magnetic field measurement(s) received from sensor 102 and determine when to turn ON or OFF the output switch 120 (e.g., one or more MOSFETs). In some examples, control circuitry 108 may be relatively simple, e.g., composed of or include a voltage-based comparator threshold with hysteresis. In other examples, control circuitry 108 may be relatively complicated, e.g., composed of or include an analog-to-digital converter (ADC) converting the field and digital signal processing to determine such measurements as an angle between two magnetic fields (e.g., using ATAN2 or other suitable matrix/vector calculations). The specific threshold to turn ON or OFF can be based on a fixed reference voltage or can be based on a non-volatile memory setting (such as EEPROM, OTP, etc.). In some examples, control circuitry 108 can be referred to as an "ON/OFF processor" or "means for determining an ON/OFF condition" or the like.

Output switch 120 may be composed of or include a single transistor (one or more FETs or bipolar transistors). For example, as shown in FIG. 1A for the case of a unidirectional DC input signal, output switch 120 can include a single MOSFET. For further examples, as shown in FIG. 1B, output switch 120 can include two back-to-back transistors (e.g., MOSFETs) for a bidirectional or AC input signal. The output switch(es) 120 are turned ON or OFF by charge pump 112. In some embodiments and examples, the output switch(es) 120 may be integrated into the device for the smallest size; in some embodiments and examples output switch(es) 120 may be external to switch (device) 100, e.g., for applications where design flexibility is desired.

Types of switches (e.g., power devices) that can be used as/for output switch 120 may include, but are not limited to, power MOSFETs, HEMTs, silicon carbide (SiC) or gallium nitride (GaN) MOSFETs; moreover, while FETs are described for some examples above, use of bipolar solid state devices is within the scope of the present disclosure, e.g., IGBTs, NPN bipolar transistors, etc. In some examples and embodiments, output switches can be either monolithically integrated as or in one integrated circuit (IC) or as discrete components, e.g., co-packaged with the rest of the circuit.

Rectifier 114 can be used to rectify the input signal for the internal regulator. In the case of a unidirectional DC input device (FIG. 1A), rectifier 114 can include a single diode used to provide a supply voltage from the positive terminal to the internal power circuits (low-power regulator 110 and charge pump 112), with the ground reference shown as T−. In the case of a bidirectional or AC input signal device (FIG. 1B), rectifier 114 can include two diodes 115 and 116 to rectify the input signal for the internal regulators and the back-to-back MOSFET body diodes (of 122 and 124) act as two of the four rectifier diodes in the system. In the bidirectional or AC input signal device, a virtual ground is generated at the node between the back-to-back MOSFETs, as shown.

Low-power regulator 110 turns ON and OFF the magnetic field sensor 102 (e.g., Hall effect sensor) and control circuitry (internal logic) 108 based on a certain (specified or implemented) scan rate. In some examples, the scan rate may be set in hardware, or as a configurable non-volatile memory setting.

Charge Pump 112 can include or be a regulator that generates a voltage to power the gate(s) of the solid state output switch 120 (e.g., MOSFET or MOSFETs). In operation, charge pump 112 applies the charge pump output voltages to the MOSFET gates whenever the magnetic field measured exceeds the target threshold, and the MOSFET gates are turned OFF by shorting the gates to the MOSFET source when the magnetic field does not exceed the target threshold. In the "ON" state, when the magnetic field measured exceeds the target threshold, the MOSFET gates are turned OFF at a certain rate or based on the decay of the voltage of the MOSFET gates so that device can maintain enough charge to continue to operate. In some examples, the charge pump functionality of this device can be functionally similar to an ideal diode controller.

Figure 2:
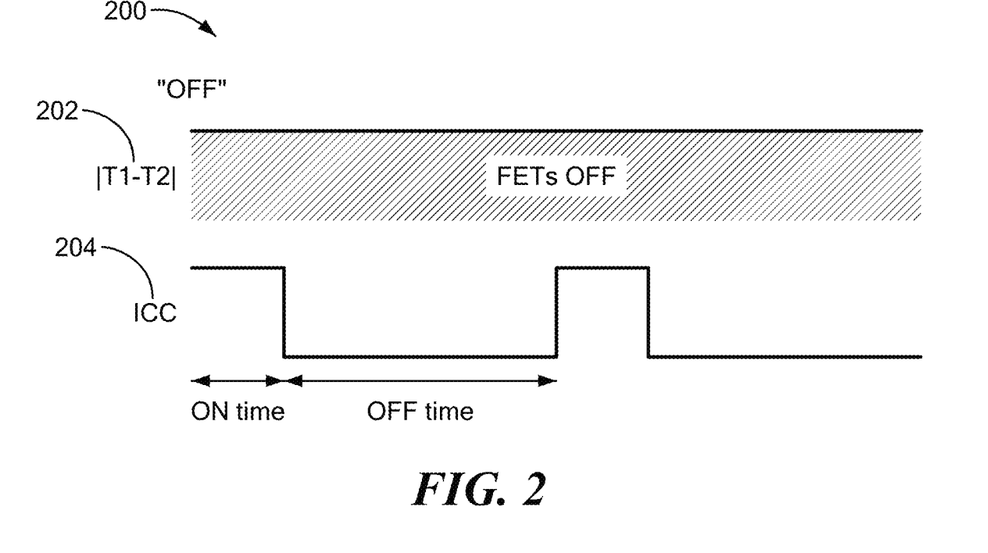
FIG. 2 is diagrams depicting an OFF, or output OPEN, operational state for a magnetically-activated solid state switch, in accordance with the present disclosure.
Figure 3:
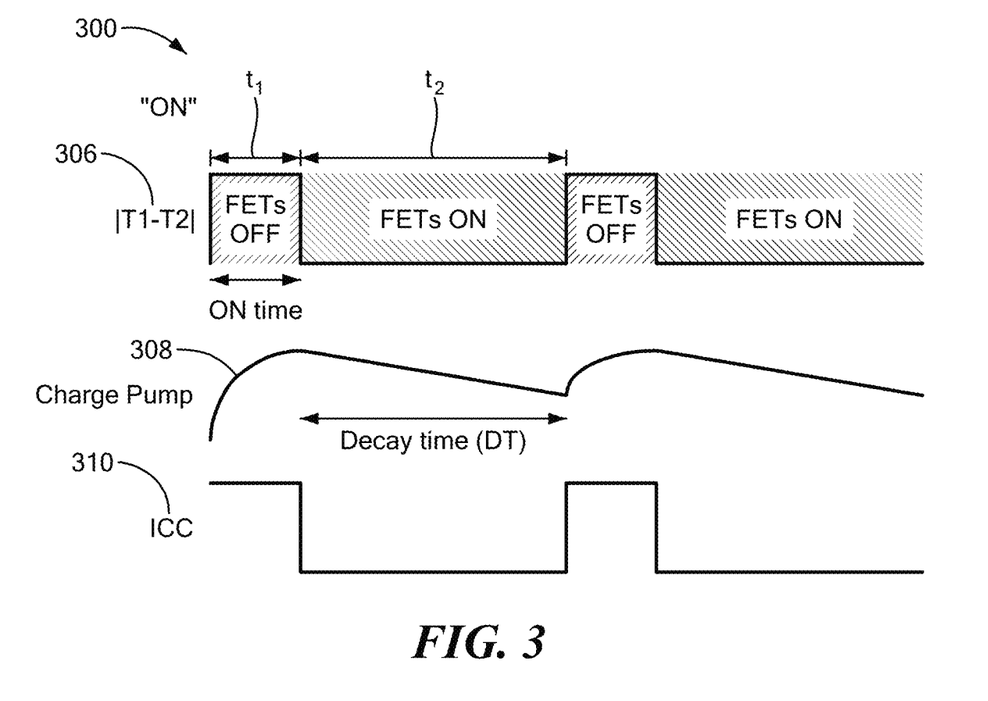
FIG. 3 is diagrams depicting an ON, or output CLOSED, operational state for a magnetically-activated solid state switch, in accordance with the present disclosure.

FIGS. 2-3 are diagrams depicting OFF and ON operational states, respectively, for an example magnetically-activated solid state switch, in accordance with the present disclosure. FIG. 2 shows an example OFF state 200 for a magnetically-activated solid state switch (device), e.g., 100A of FIG. 1A, in accordance with the present disclosure. As shown in FIG. 2, when the device is OFF—because one or more magnetic field properties do(es) not exceed the defined threshold(s)—the output switch is OFF and the voltage across T+ to T− or T1 to T2 (shown as 202) is high. Examples of such magnetic field properties can include the magnitude of the field or the angle between two magnetic field components. The device low-power regulator will be periodically waking up (shown by current $I_{CC}$ 204) and taking a magnetic field measurement. If the magnetic field exceeds the target threshold, the device will move to the "ON" state (e.g., by operation of control circuitry or ON/OFF logic) as shown in FIG. 3. FIG. 3

FIG. 3 shows an example ON state 300 for a magnetically-activated solid state switch (device), e.g., 100A of FIG. 1A, in accordance with the present disclosure. When the device is ON, because the magnetic field exceeds the defined threshold, the output switch is ON and the voltage (shown at 306) across the device terminals (e.g., T+ to T− or T1 to T2 in FIGS. 1A-1B) is low, i.e., shorted.

Since shorting the device terminals (e.g., T+ to T− or T1 to T2 in FIGS. 1A-1B) will remove the device's power source, the device can respond in one of two ways:

(1) Periodically turn OFF the entire output switch: When the output switch is turned OFF, the voltage across T+ to T− or T1 to T2 becomes large and the device can store enough energy to turn the MOSFETs ON again and measure the magnetic field.

(2) In the case of the bidirectional device, periodically turn OFF one of the two MOSFETs so that current can continue to flow through the body diode.

The device low-power regulator will be periodically waking up, as shown by charge pump charge accumulation 308 and current $I_{CC}$ 310 and taking a magnetic field measurement. If the magnetic field no longer exceeds the target threshold, the device (solid state switch) will move to the "OFF" state (e.g., 200 in FIG. 2).

Figure 4:
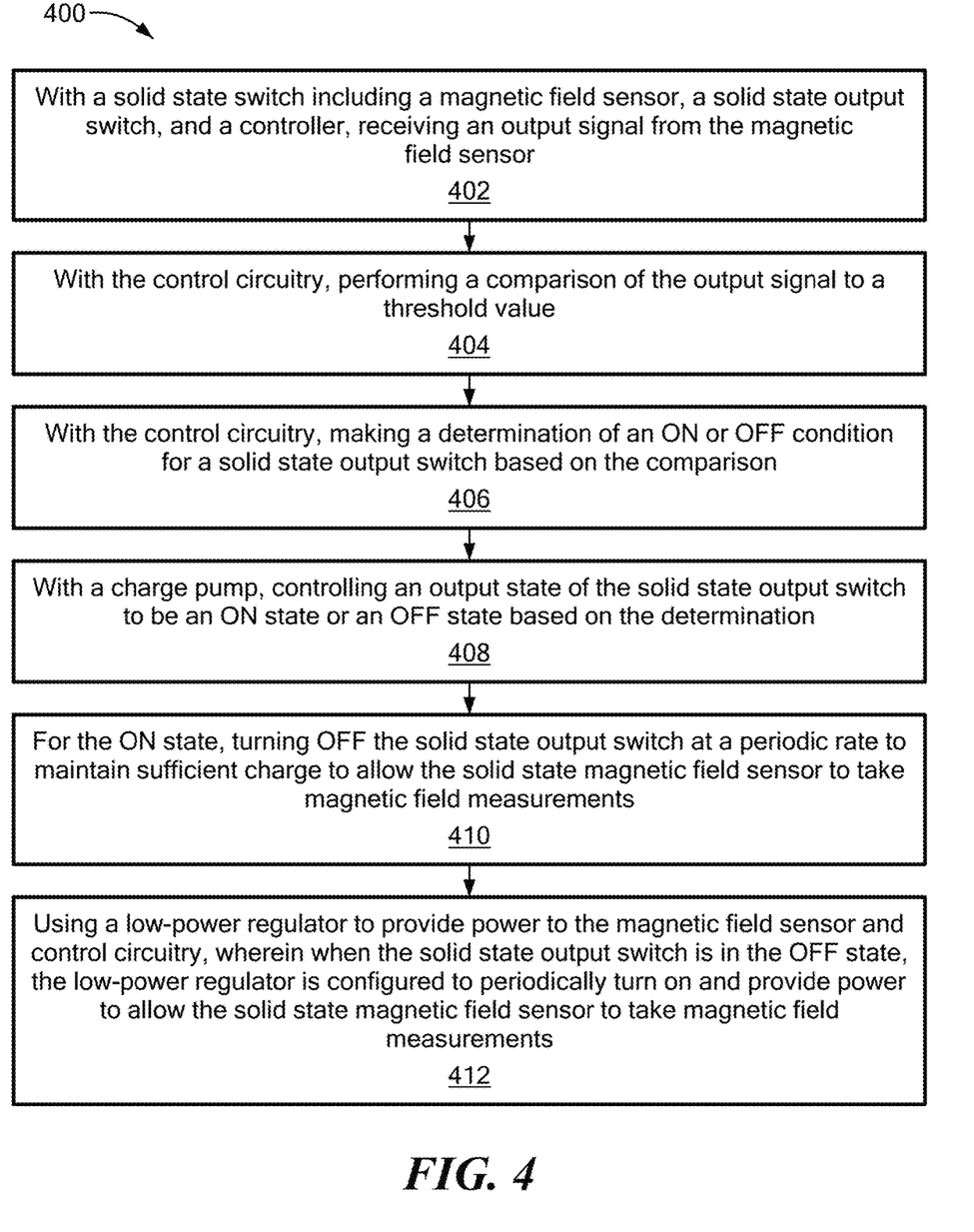
FIG. 4 is a block diagram of an example method of controlling a magnetically-activated solid state output switch, in accordance with the present disclosure.

FIG. 4 is a block diagram of an example method 400 of controlling a solid state output switch, in accordance with the present disclosure. For method 400, with a magnetically-activated solid state switch including a magnetic field sensor, a solid state output switch, and control circuitry (e.g., a controller implementing ON/OFF logic), an output signal can be received from the magnetic field sensor, as described at 402. With the control circuitry, a comparison of the output signal to a threshold value can be performed, as described at 404. With the control circuitry, a determination of an ON or OFF condition can be made for the solid state output switch based on the comparison, as described at 406.

Further for method 400, with a charge pump, an output state of the solid state output switch can be controlled to be an ON state or an OFF state based on the determination, as described at 408. For the ON state, the solid state output switch can be turned OFF at a periodic rate (or after a desired amount of time) to maintain sufficient charge to allow the solid state magnetic field sensor to take magnetic field measurements, as described at 410. Using a low-power regulator, power can be provided periodically to the magnetic field sensor and control circuitry when the solid state output switch is in the OFF state to provide power to allow the solid state magnetic field sensor to take magnetic field measurements, as described at 412.

Figure 5:
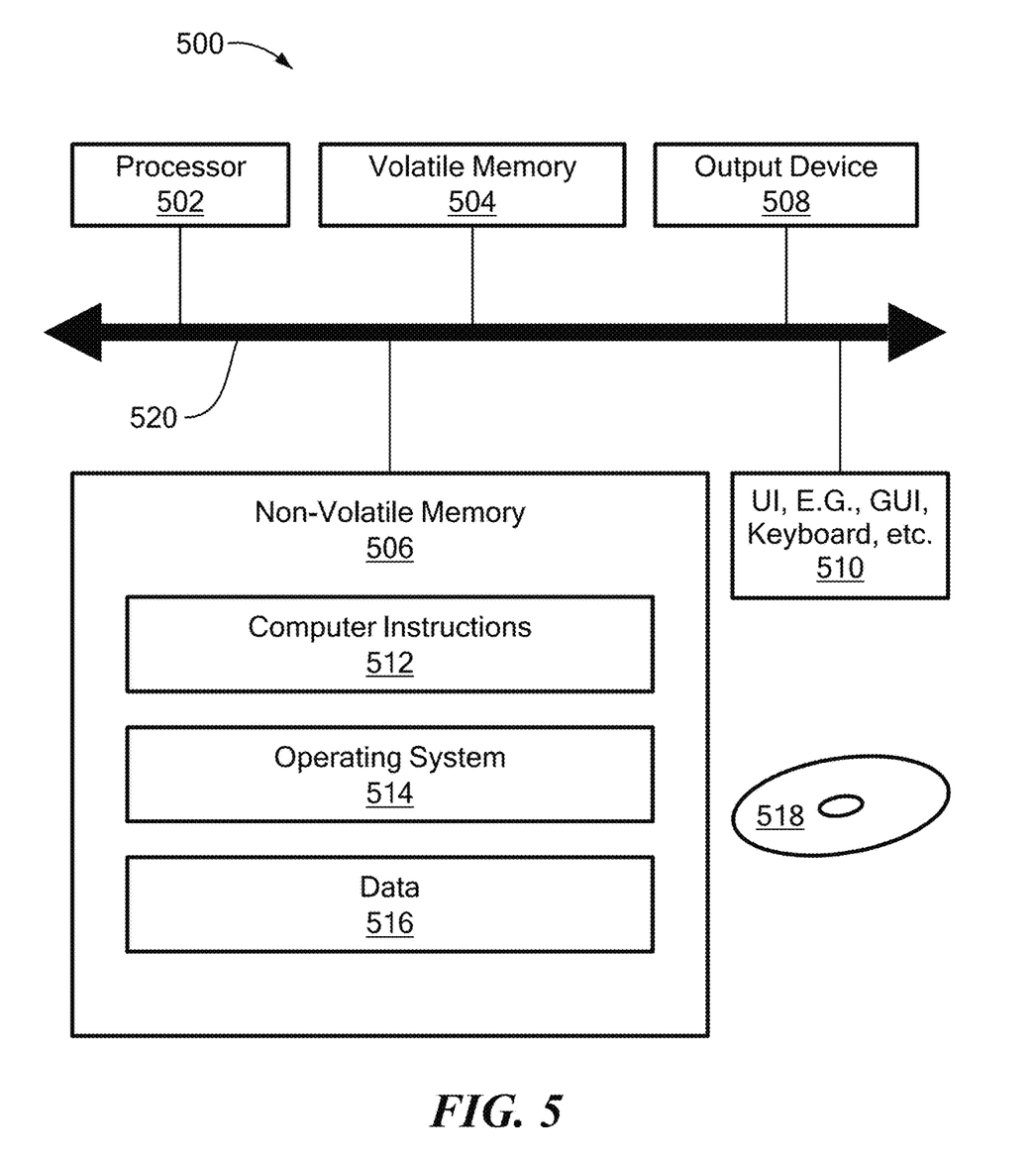
FIG. 5 is a block diagram of an example computer system operative to perform processing, in accordance with the present disclosure.

FIG. 5 is a block diagram of an example computer system 500 operative to perform processing, in accordance with the present disclosure. Computer system 500 can perform all or at least a portion of the processing, e.g., steps in the algorithms and methods, described herein. The computer system 500 includes a processor 502, a volatile memory 504, a non-volatile memory 506 (e.g., hard disk, EEPROM, OTP memory, etc.), an output device 508 and a user input or interface (UI) 510, e.g., graphical user interface (GUI), a mouse, a keyboard, a display, and/or any common user interface, etc. The non-volatile memory (non-transitory storage medium) 506 stores computer instructions 512 (a.k.a., machine-readable instructions or computer-readable instructions) such as software (computer program product), an operating system 514 and data 516. In some examples, non-volatile memory programming interface (e.g., US 510 and/or suitable communication link) can be used which allows device non-volatile memory 506 to be configured. In some examples, the computer instructions 512 are executed by the processor 502 out of (from) volatile memory 504. In one embodiment, an article 518 (e.g., a storage device or medium such as a hard disk, an optical disc, magnetic storage tape, optical storage tape, flash drive, etc.) includes or stores the non-transitory computer-readable instructions. Bus 520 is also shown.

Processing may be implemented in hardware, software, or a combination of the two. Processing may be implemented in computer programs (e.g., one or more software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 500 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as, special purpose logic circuitry, e.g., an FPGA (field programmable gate array) and/or an ASIC (application-specific integrated circuit). In some examples, digital logic circuitry, e.g., one or more FPGAs, can be operative as a processor as described herein.

Accordingly, aspects, examples, and/or embodiments of the inventive subject matter can afford various benefits relative to prior art techniques. For example, embodiments and examples of the present disclosure can provide magnetically-activated solid state switches that: may have one or multiple magnetic thresholds programmed, e.g., at the end-of line in production or directly in the customer application with integrated non-volatile memory; do not "stick" or "miss"; are durable, robust, and/or resistant to shock and vibration; do not wear out (e.g., mechanically fail) over long times (e.g., a typically life span of a mechanical reed switch); are configurable to sense all three axis (X, Y, Z axes), one or multiple axes, and/or can be used interchangeably with reed switches.

Various embodiments and examples of the concepts, systems, devices, structures, and techniques sought to be protected are described above with reference to the related drawings. Alternative embodiments can be devised without departing from the scope of the concepts, systems, devices, structures, and techniques described. For example, while examples are described as including types of FETs (e.g., MOSFETs), in other examples and/or embodiments, output switches can include or be composed of other types of FETS and/or bipolar transistors (e.g., IGBTs).

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A solid state switch comprising:
   a. a magnetic field sensor configured to make a magnetic field measurement and produce a corresponding output signal;
   b. a solid state output switch configured to produce an output current in an ON state and to produce negligible current in an OFF state;
   c. control circuitry configured to implement ON/OFF logic for determining an ON or OFF condition for the solid state output switch and controlling the solid state output switch to be in the ON state or the OFF state, respectively;
   d. a charge pump connected to the solid state output switch and control circuitry and configured to (i) respond to the control circuitry determining an OFF condition by supplying voltage to the solid state output switch to switch the solid state output switch to the OFF state, and (ii) respond to the control circuitry determining an ON condition by turning the solid state output switch to the ON state, wherein in the ON state, the solid state output switch is configured by the control circuitry to turn OFF at a periodic rate to maintain sufficient charge to allow the solid state magnetic field sensor to sense a magnetic field; and
   e. a low-power regulator configured to provide power to the magnetic field sensor and control circuitry, wherein when the solid state output switch is in the OFF state, wherein the low-power regulator is configured to periodically turn on and provide power to the magnetic field sensor for taking a magnetic field measurement.

2. The solid state switch of claim 1, wherein the periodic rate is based on a value stored in the control circuitry.

3. The solid state switch of claim 1, wherein the periodic rate is based on a decay of a voltage of the solid state output switch.

4. The solid state switch of claim 1, wherein the magnetic field sensor comprises one or more Hall effect elements.

5. The solid state switch of claim 4, further comprising a driver circuit configured to provide bias voltage to the one or more Hall effect elements.

6. The solid state switch of claim 1, wherein the magnetic field sensor comprises one or more magnetoresistance (MR) elements.

7. The solid state switch of claim 6, wherein the one or more MR elements comprise one or more giant magnetoresistance (GMR) elements.

8. The solid state switch of claim 6, wherein the one or more MR element comprise one or more anisotropic magnetoresistance element (AMR) elements.

9. The solid state switch of claim 6, wherein the one or more MR element comprise one or more tunneling magnetoresistance (TMR) elements.

10. The solid state switch of claim 1, wherein the magnetic field sensor is configured to measure the magnetic field along one axis.

11. The solid state switch of claim 1, wherein the magnetic field sensor is configured to measure the magnetic field along two axes.

12. The solid state switch of claim 1, wherein the magnetic field sensor is configured to measure the magnetic field along three axes.

13. The solid state switch of claim 1, wherein the solid state output switch comprises a field effect transistor (FET) or a bipolar transistor.

14. The solid state switch of claim 13, wherein the field effect transistor (FET) comprises a MOSFET.

15. The solid state switch of claim 13, wherein the solid state output switch comprises first and second MOSFETs in a back-to-back configuration to prevent reverse current flow in either direction when OFF.

16. The solid state switch of claim 1, wherein the control circuitry comprises a comparator configured to compare a voltage output from the magnetic field sensor to a threshold voltage.

17. The solid state switch of claim 1, wherein the control circuitry comprises a digital signal processor (DSP) configured to calculate a position angle based on two output signals received from the magnetic field sensor.

18. The solid state switch of claim 17, further comprising an analog-to-digital converter (ADC) configured to receive one or more analog signals from the magnetic field sensor and produce corresponding digital signals.

19. The solid state switch of claim 1, wherein the magnetic field measurement comprises a magnetic flux density measurement.

20. A method of controlling a solid state switch having a solid state output switch and a magnetic field sensor, the method comprising:

a. with control circuitry, receiving an output signal from a magnetic field sensor;
b. with the control circuitry, performing a comparison of the output signal to a threshold value;
c. with the control circuitry, performing a determination of an ON or OFF state for a solid state output switch based on the comparison;
d. with the control circuitry, controlling an output state of the solid state output switch to be an ON state or an OFF state based on the determination;
e. providing a charge pump connected to the solid state output switch and control circuitry and configured to (i) respond to the control circuitry determining an OFF condition by supplying voltage to the solid state output switch to switch the solid state output switch to the OFF state, and (ii) respond to the control circuitry determining an ON condition by turning the solid state output switch to the ON state, wherein in the ON state, the solid state output switch is configured by the control circuitry to turn OFF at a periodic rate to maintain sufficient charge to allow the solid state magnetic field sensor to sense a magnetic field; and
f. providing a low-power regulator configured to provide power to the magnetic field sensor and control circuitry, wherein when the solid state output switch is in the OFF state, wherein the low-power regulator is configured to periodically turn on and provide power to the magnetic field sensor for taking a magnetic field measurement.

21. The method of claim 20, wherein the magnetic field sensor comprises one or more Hall effect elements.

22. The method of claim 20, wherein the magnetic field sensor comprises one or more magnetoresistance elements.

23. The method of claim 22, wherein the one or more magnetoresistance elements comprise one or more AMR elements.

24. The method of claim 22, wherein the one or more magnetoresistance elements comprise one or more GMR elements.

25. The method of claim 22, wherein the one or more magnetoresistance elements comprise one or more TMR elements.

26. The method of claim 20, wherein the solid state output switch comprises a field effect transistor (FET) or a bipolar transistor.

27. The method of claim 26, wherein the FET comprises a MOSFET.

28. The method of claim 26, wherein the solid state output switch comprises a first MOSFET coupled to a second MOSFET in a back to back configuration.

29. The method of claim 20, further comprising retrofitting the solid state switch in place of a magnetic reed switch.

* * * * *

UNITED STATES PATENT AND TRADEMARK OFFICE
CERTIFICATE OF CORRECTION

| | | |
|---|---|---|
| PATENT NO. | : 12,126,340 B2 | Page 1 of 1 |
| APPLICATION NO. | : 18/174957 | |
| DATED | : October 22, 2024 | |
| INVENTOR(S) | : Matthew Hein | |

It is certified that error appears in the above-identified patent and that said Letters Patent is hereby corrected as shown below:

In the Claims

Column 11, Line 13, delete "element comprise" and replace with --elements comprises--.

Column 11, Line 16, delete "element comprise" and replace with --elements comprises--.

Signed and Sealed this
Twenty-ninth Day of April, 2025

Coke Morgan Stewart
*Acting Director of the United States Patent and Trademark Office*